United States Patent
Mansfield et al.

(10) Patent No.: US 8,166,423 B2
(45) Date of Patent: Apr. 24, 2012

(54) PHOTOMASK DESIGN VERIFICATION

(75) Inventors: Scott M. Mansfield, Hopewell Junction, NY (US); James A. Bruce, Essex Junction, VT (US); Gregory J. Dick, Hopewell Junction, NY (US); Ioana Graur, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 385 days.

(21) Appl. No.: 12/555,219

(22) Filed: Sep. 8, 2009

(65) Prior Publication Data

US 2011/0061030 A1    Mar. 10, 2011

(51) Int. Cl.
    *G06F 17/50*    (2006.01)
(52) U.S. Cl. ............ 716/51; 716/50; 716/52; 716/53; 716/54; 716/55
(58) Field of Classification Search .......... 716/50–55
    See application file for complete search history.

(56) References Cited

U.S. PATENT DOCUMENTS

| | | | |
|---|---|---|---|
| 6,049,660 A * | 4/2000 | Ahn et al. | 703/13 |
| 6,757,645 B2 | 6/2004 | Chang et al. | |
| 7,350,183 B2 * | 3/2008 | Cui et al. | 716/52 |
| 7,503,028 B2 * | 3/2009 | Mukherjee et al. | 716/51 |
| 7,512,927 B2 * | 3/2009 | Gallatin et al. | 716/51 |
| 7,550,235 B2 * | 6/2009 | Shi et al. | 430/5 |
| 7,921,383 B1 * | 4/2011 | Wei | 716/54 |
| 2006/0101370 A1 * | 5/2006 | Cui et al. | 716/19 |

* cited by examiner

*Primary Examiner* — Sun Lin
(74) *Attorney, Agent, or Firm* — Yuanmin Cai; Hoffman Warnick LLC (57) ABSTRACT

Solutions for verifying photomask designs are disclosed. In one embodiment, a method of verifying a photomask design includes: simulating an initial semiconductor manufacturing process using a plurality of mask shapes and variation models for the initial semiconductor manufacturing process, to generate a plurality of contours for the initial semiconductor manufacturing process; simulating a subsequent semiconductor manufacturing process using the contours for the initial semiconductor manufacturing process and variation models for the subsequent semiconductor manufacturing process, to generate a plurality of contours for the subsequent semiconductor manufacturing process; repeatedly simulating at least one further subsequent semiconductor manufacturing process using a plurality of contours for the subsequent semiconductor manufacturing process and variation models for the further subsequent semiconductor manufacturing process; and generating and storing a verification result for the photomask design on a computer readable storage medium.

20 Claims, 7 Drawing Sheets

PHOTOMASK DESIGN VERIFICATION

BACKGROUND OF THE INVENTION

The subject matter disclosed herein relates to solutions for photomask design verification. More specifically, the subject matter disclosed herein relates to using a plurality of process models and verification techniques to improve the accuracy of printed photomasks.

As semiconductor devices decrease in size, fabrication processes are refined to create smaller device designs. As a result, resolution limits of the tools and materials used to fabricate these smaller semiconductor devices are tested. In order to prevent failures in design configurations, fabricators have specified design rules for device designers to follow. While these design rules aid in reducing failures during fabrication, they can be overly restrictive on designers and may not be modified frequently enough to keep designs competitive.

BRIEF DESCRIPTION OF THE INVENTION

Solutions for photomask design verification are disclosed. In one aspect, a method of verifying a photomask design is disclosed, the method comprising: simulating an initial semiconductor manufacturing process using a plurality of mask shapes and variation models for the initial semiconductor manufacturing process, to generate a plurality of contours for the initial semiconductor manufacturing process; simulating a subsequent semiconductor manufacturing process using the contours for the initial semiconductor manufacturing process and variation models for the subsequent semiconductor manufacturing process, to generate a plurality of contours for the subsequent semiconductor manufacturing process; repeatedly simulating at least one further subsequent semiconductor manufacturing process using a plurality of contours for the subsequent semiconductor manufacturing process and variation models for the further subsequent semiconductor manufacturing process; and generating and storing a verification result for the photomask design on a computer readable storage medium.

A first aspect of the invention provides a method of verifying a photomask design, the method comprising: simulating an initial semiconductor manufacturing process using a plurality of mask shapes and variation models for the initial semiconductor manufacturing process, to generate a plurality of contours for the initial semiconductor manufacturing process; simulating a subsequent semiconductor manufacturing process using the contours for the initial semiconductor manufacturing process and variation models for the subsequent semiconductor manufacturing process, to generate a plurality of contours for the subsequent semiconductor manufacturing process; repeatedly simulating at least one further subsequent semiconductor manufacturing process using a plurality of contours for the subsequent semiconductor manufacturing process and variation models for the further subsequent semiconductor manufacturing process; and generating and storing a verification result for the photomask design on a computer readable storage medium.

A second aspect of the invention provides a system for verifying a photomask design, the system comprising: a computer-implemented simulator for: simulating an initial semiconductor manufacturing process using a plurality of mask shapes and variation models for the initial semiconductor manufacturing process, to generate a plurality of contours for the initial semiconductor manufacturing process; simulating a subsequent semiconductor manufacturing process using the contours for the initial semiconductor manufacturing process and variation models for the subsequent semiconductor manufacturing process, to generate a plurality of contours for the subsequent semiconductor manufacturing process; and repeatedly simulating at least one further subsequent semiconductor manufacturing process using a plurality of contours for the subsequent semiconductor manufacturing process and variation models for the further subsequent semiconductor manufacturing process.

A third aspect of the invention provides a computer program product stored on a computer readable storage medium, which when executed by a computer, performs the following: simulates an initial semiconductor manufacturing process using a plurality of mask shapes and variation models for the initial semiconductor manufacturing process, to generate a plurality of contours for the initial semiconductor manufacturing process; simulates a subsequent semiconductor manufacturing process using the contours for the initial semiconductor manufacturing process and variation models for the subsequent semiconductor manufacturing process, to generate a plurality of contours for the subsequent semiconductor manufacturing process; and repeatedly simulates at least one further subsequent semiconductor manufacturing process using a plurality of contours for the subsequent semiconductor manufacturing process and variation models for the further subsequent semiconductor manufacturing process.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide solutions for verifying photomask designs. As used herein, the term "semiconductor manufacturing process" may include any of one or more steps taken in creating a semiconductor device. These processing steps may generally include, for example, designing one or more photomasks, photomask formation, lithography, etching, and verification. While portions of the disclosure specifically refer to photomask design verification, it is understood that aspects of the invention may be applied to other semiconductor manufacturing processes known in the art.

The following figures may assist in illustrating various aspects of the invention. As shown in these figures, process steps and/or specific computer system components are illustrated using rectangular boxes and/or hexagonal shapes. Objects (e.g., targets or shapes) are illustrated using boxes with rounded edges (oblong enclosures), and are labeled with the prefix "O", while decisions are illustrated using diamond-shaped enclosures and are labeled with the prefix "D."

Figure 1:
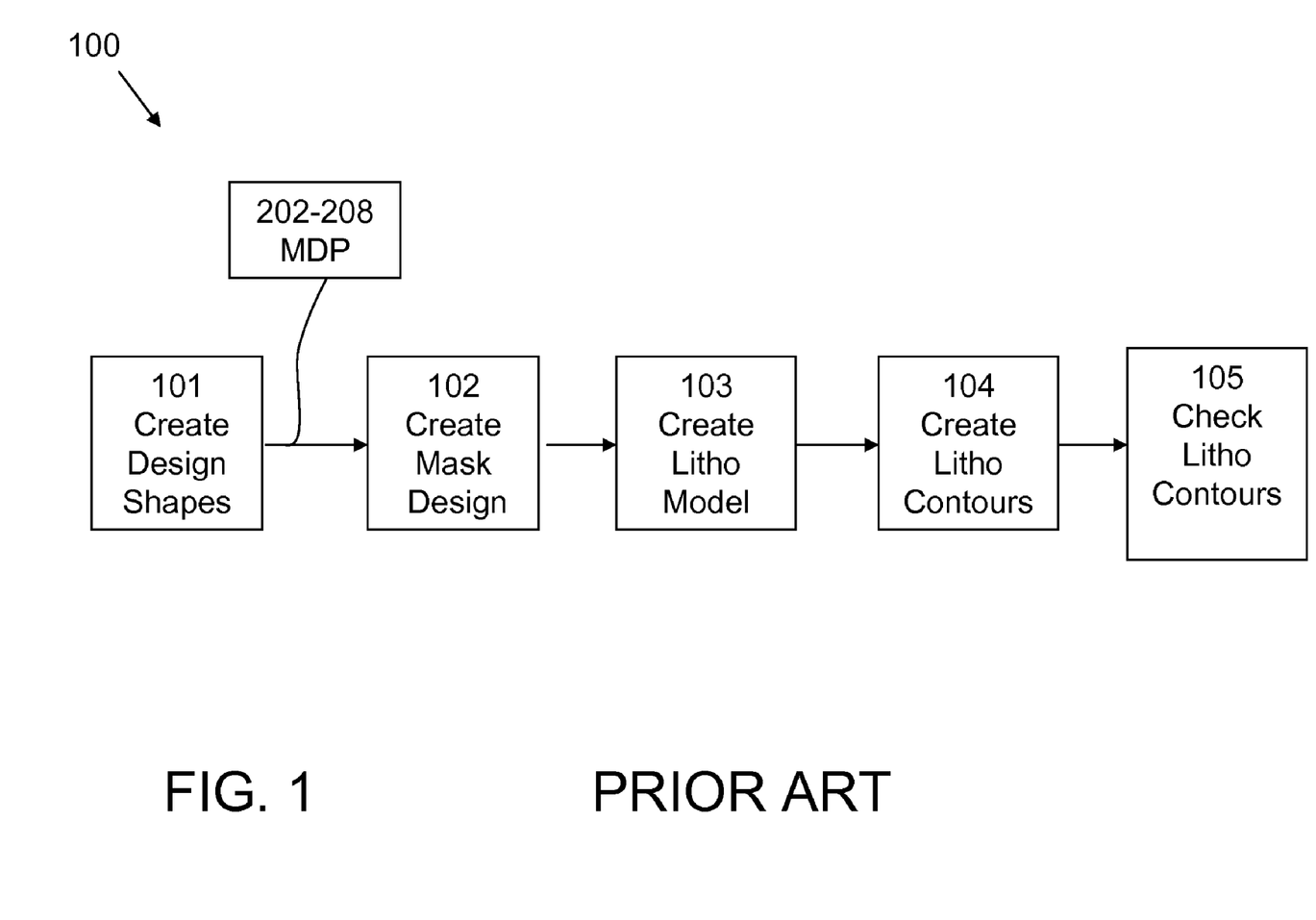
FIG. 1 shows a process flow diagram illustrating steps in a prior art method of design verification.

Turning to the drawings, FIG. 1 shows a schematic flow diagram illustrating steps in a semiconductor design verification process. This prior art method involves simulating portions of the semiconductor fabrication process based upon design shapes. In step 101, a semiconductor device layout is parsed into a plurality of semiconductor design shapes. These design shapes are then used to create a mask design (step 102) which will allow for creation of the design shapes on the semiconductor device. Creation of the mask design from the design shapes (step 102) is commonly achieved through conventional mask-data-preparation (MDP). MDP is further described with reference to FIG. 2 and steps 201-209. From the mask design, in step 103, a lithography model is created. In step 104, the lithography model may then be used to create lithography contours, which represent simulated lithography shapes contained within the lithography model. In step 105, those lithography contours are checked to verify feasibility of production, accuracy, etc. In this method, the check is performed on the lithography portion of the process.

Figure 2:
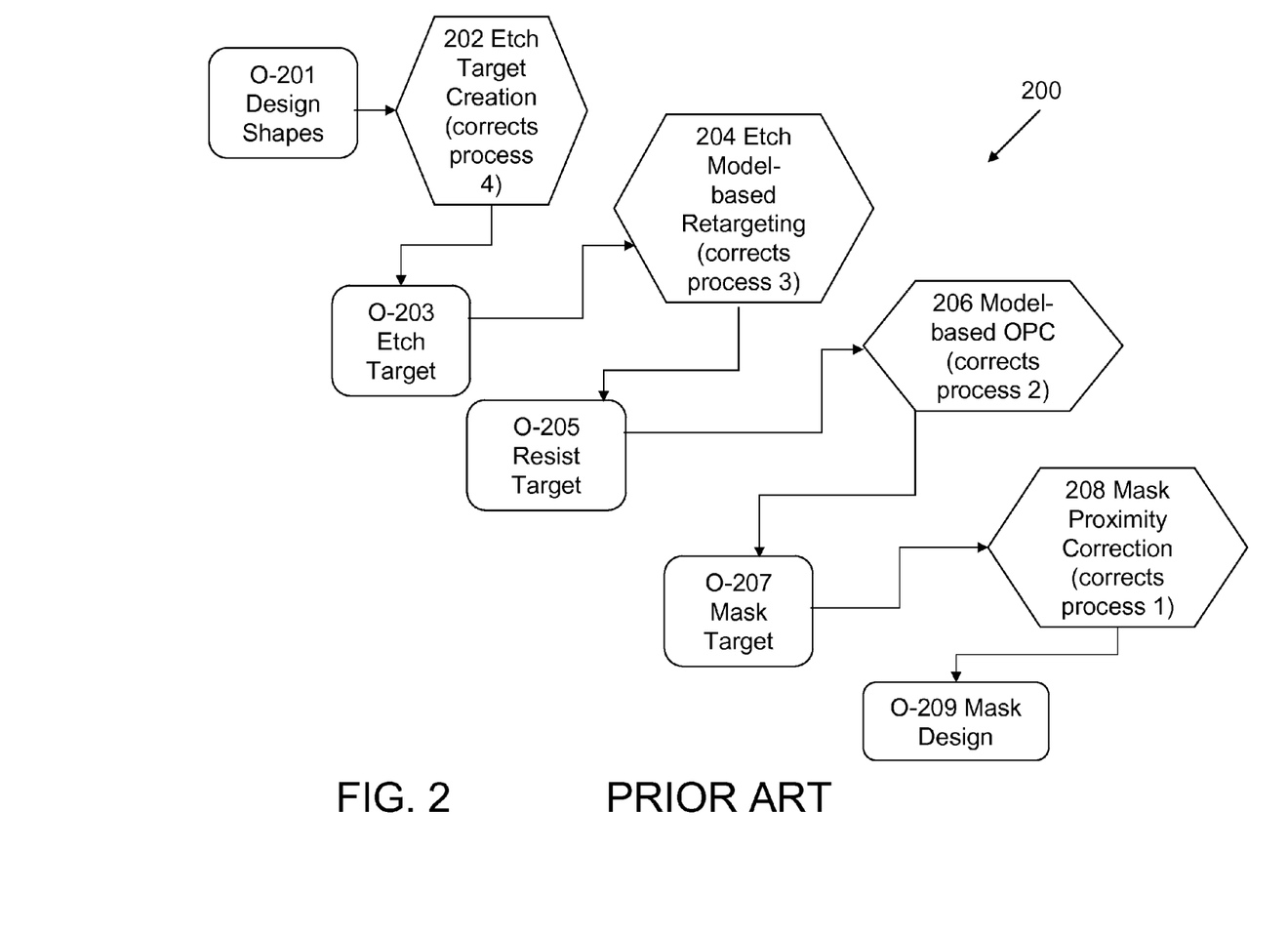
FIG. 2 shows a process flow diagram illustrating steps in a prior art method of design verification.

FIG. 2 shows a schematic flow diagram 200 illustrating steps in the MDP process described with reference to step 102 of FIG. 1. As is known in the art of semiconductor device design, the MDP process converts semiconductor device design shapes into a mask design. In step 202, MDP may first convert semiconductor device design shapes (O-201) into etch targets (O-203). Etch target (O-203) may include shapes to be etched, such as, for example, lines and vias. In step 204, etch target (O-203) is then put through an etch model-based retargeting process which generates a resist target (O-205) from the etch target (O-203) and its shapes. In step 206, resist target (O-205) is then put through a model-based optical proximity correction process (OPC) to create a mask target (O-207). In step 208, mask target (O-207) is then put through a mask proximity correction process to produce a mask design (O-209). Mask design (O-209) shown in FIG. 2 corresponds to the mask design described with reference to FIG. 1.

When using the prior art method of FIG. 1 in conjunction with the MDP process of FIG. 2, checking and correcting errors in processes other than lithography is not feasible. Accordingly, such methods do not provide accurate forecasts of the total patterning process.

Figure 3:
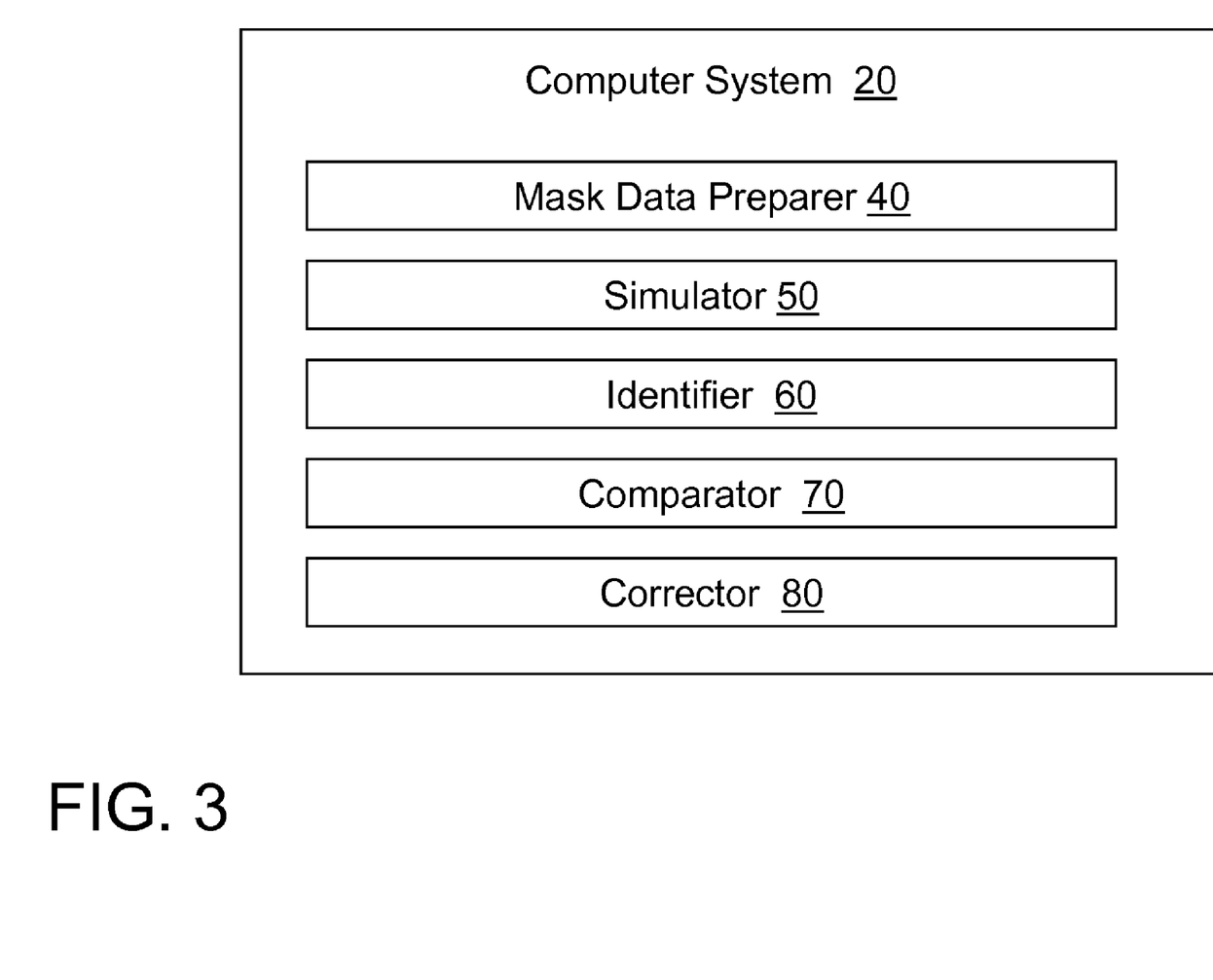
FIG. 3 shows a schematic diagram of an embodiment of a computer system according to one embodiment of the invention.
Figure 4:
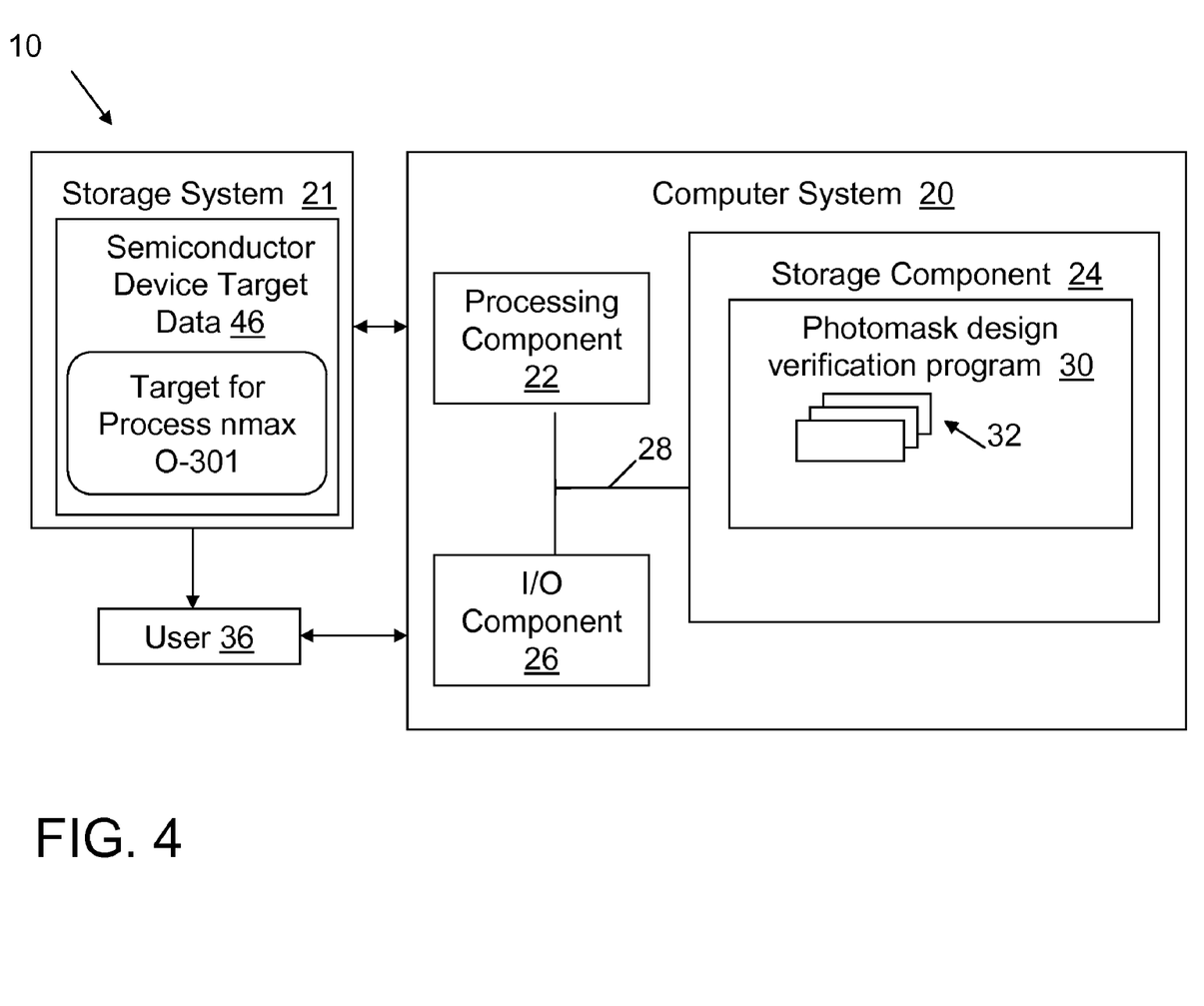
FIG. 4 shows a schematic diagram of an embodiment of a computer system according to one embodiment of the invention.

Turning to FIG. 3, a computer system 20 is shown including a plurality of components. Computer system 20 may include a mask data preparer 40, a simulator 50, an identifier 60, a comparator 70 and a corrector 80. The functions of these components will be further explained with reference to FIGS. 4-8. In one embodiment, mask data preparer 40, simulator 50, identifier 60, comparator 70 and corrector 80 may be a plurality of hardware components within computer system 20. However, in another embodiment, these components may be implemented as modules in a photomask verification program 30 (FIG. 4). In any case, these components may be configured to perform the functions described herein.

Turning to FIG. 4, an illustrative environment 10 for photomask design verification is shown. To this extent, environment 10 includes a computer system 20 that can perform a process described herein in order to verify a photomask design. In particular, computer system 20 is shown including a photomask design verification program 30, which makes computer system 20 operable to verify a photomask design by performing a process described herein.

Computer system 20 is shown in communication with storage system 21, which may include semiconductor device target data 46. Further, computer system 20 is shown in communication with a user 36. A user may, for example, be a programmer or operator. Interactions between these components and computer system 20 will be discussed in subsequent portions of this application. Computer system 20 is shown including a processing component 22 (e.g., one or more processors), a storage component 24 (e.g., a storage hierarchy), an input/output (I/O) component 26 (e.g., one or more I/O interfaces and/or devices), and a communications pathway 28. In one embodiment, processing component 22 executes program code, such as photomask verification program 30, which is at least partially embodied in storage component 24. While executing program code, processing component 22 can process data, which can result in reading and/or writing the data to/from storage component 24 and/or I/O component 26 for further processing. Pathway 28 provides a communications link between each of the components in computer system 20. I/O component 26 can comprise one or more human I/O devices or storage devices, which enable user 36 and/or storage system 42 to interact with computer system 20 and/or one or more communications devices to enable user 36 to communicate with computer system 20 using any type of communications link. To this extent, photomask verification system 30 can manage a set of interfaces (e.g., graphical user interface(s), application program interface, and/or the like) that enable human and/or system interaction with photomask verification system 30.

In any event, computer system 20 can comprise one or more general purpose computing articles of manufacture (e.g., computing devices) capable of executing program code installed thereon. As used herein, it is understood that "program code" means any collection of instructions, in any language, code or notation, that cause a computing device having an information processing capability to perform a particular function either directly or after any combination of the following: (a) conversion to another language, code or notation; (b) reproduction in a different material form; and/or (c) decompression. To this extent, photomask verification program 30 can be embodied as any combination of system software and/or application software. In any event, the technical effect of computer system 20 is to provide processing instructions for photomask design verification.

Further, photomask design verification program 30 can be implemented using a set of modules 32 (e.g., components of FIG. 3). In this case, a module 32 can enable computer system 20 to perform a set of tasks used by photomask design verification program 30, and can be separately developed and/or implemented apart from other portions of photomask design verification program 30. Photomask design verification program 30 may include modules 32 which comprise a specific use machine/hardware and/or software. Regardless, it is understood that two or more modules, and/or systems may share some/all of their respective hardware and/or software. Further, it is understood that some of the functionality discussed herein may not be implemented or additional functionality may be included as part of computer system 20.

When computer system 20 comprises multiple computing devices, each computing device may have only a portion of photomask design verification program 30 embodied thereon (e.g., one or more modules 32). However, it is understood that computer system 20 and photomask design verification program 30 are only representative of various possible equivalent computer systems that may perform a process described herein. To this extent, in other embodiments, the functionality provided by computer system 20 and photomask design verification program 30 can be at least partially implemented by one or more computing devices that include any combination of general and/or specific purpose hardware with or without program code. In each embodiment, the hardware and program code, if included, can be created using standard engineering and programming techniques, respectively.

When computer system 20 includes multiple computing devices, the computing devices can communicate over any type of communications link. Further, while performing a process described herein, computer system 20 can communicate with one or more other computer systems using any type of communications link. In either case, the communications link can comprise any combination of various types of wired and/or wireless links; comprise any combination of one or more types of networks; and/or utilize any combination of various types of transmission techniques and protocols.

As discussed herein, photomask design verification program 30 enables computer system 20 to provide processing instructions for verifying photomask designs. Photomask design verification program 30 may include logic, which may include the following functions: a mask data preparer 40, a simulator 50, an identifier 60, a comparator 70 and a corrector 80. In one embodiment, photomask design verification program 30 may include logic to perform the above-stated functions. Structurally, the logic may take any of a variety of forms such as a field programmable gate array (FPGA), a microprocessor, a digital signal processor, an application specific integrated circuit (ASIC) or any other specific use machine structure capable of carrying out the functions described herein. Logic may take any of a variety of forms, such as software and/or hardware. However, for illustrative purposes, photomask design verification program 30 and logic included therein will be described herein as a specific use machine. As will be understood from the description, while logic is illustrated as including each of the above-stated functions, not all of the functions are necessary according to the teachings of the invention as recited in the appended claims.

Figure 5:
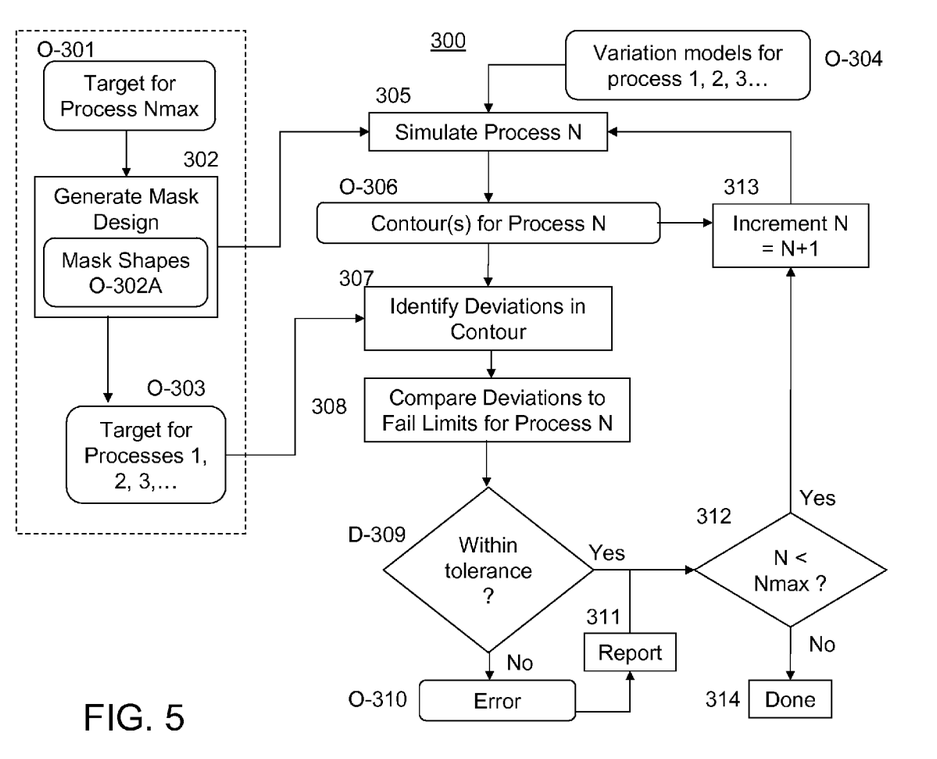
FIG. 5 shows a schematic flow diagram illustrating steps in a method of photomask design verification according to an embodiment of the invention.
Figure 6:
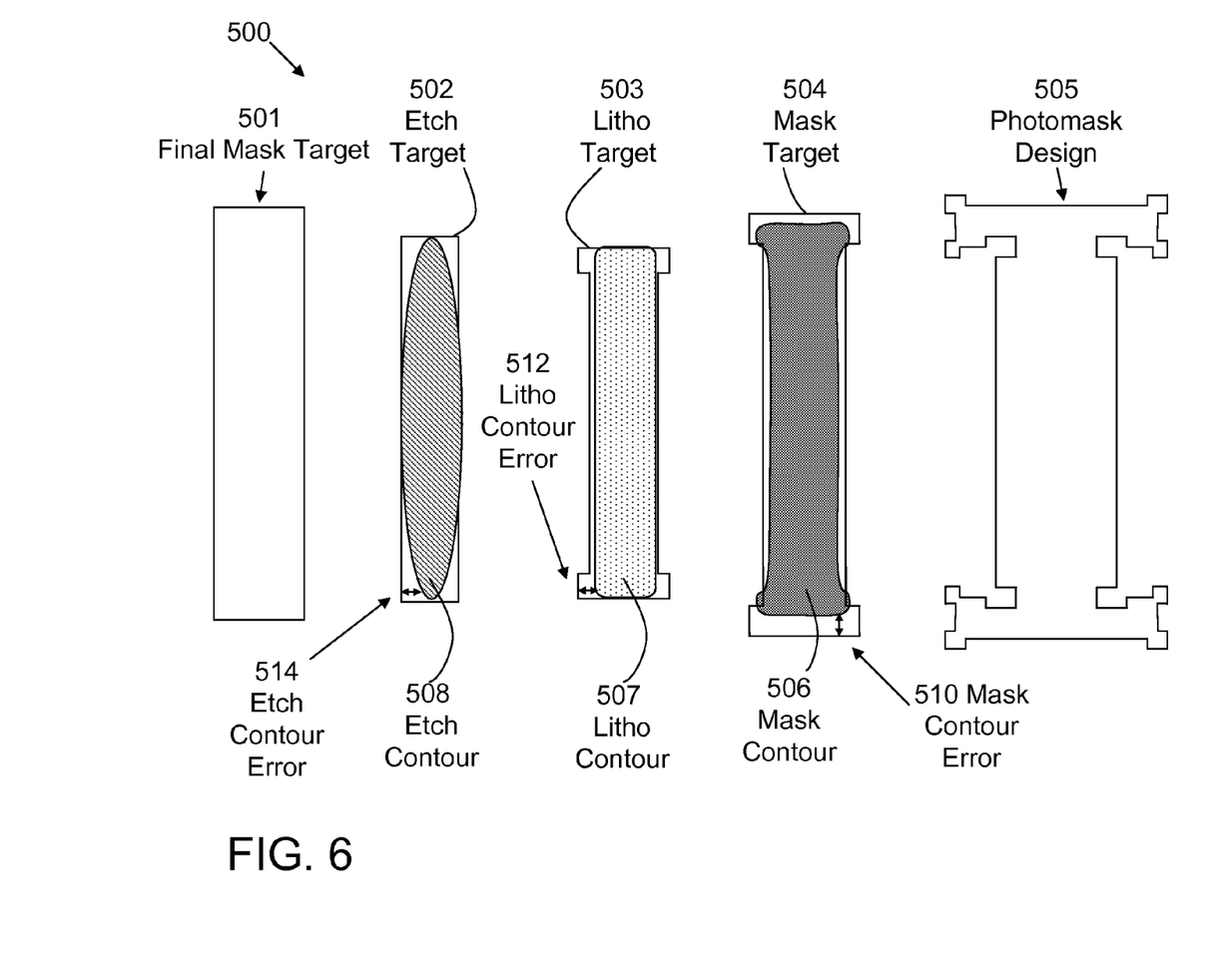
FIG. 6 shows a schematic diagram including illustrative examples of semiconductor device design shapes according to embodiments of the invention.

Turning to FIGS. 5 and 6, a schematic diagram 300 of steps in a photomask design verification process and a schematic diagram 500 including representative examples of physical mask shapes, respectively, are shown. In step 302, a target for a process Nmax (O-301) is provided to mask data preparer (MDP) 40 (FIG. 3) for generating a photomask design. It is understood that target for process Nmax O-301 may take the form of semiconductor device target data 46 (FIG. 4). Semiconductor device target data 46 may be provided by a component within computer system 20, or may be supplied by an external storage system 21 such as a database or distinct computing system. Further, semiconductor device target data 46 may be provided to computer system 20 by a user 36. User 36, may, for example, provide semiconductor device target data 46 through a user interface or other interface. It is understood, however, that semiconductor device target data 46 may be provided to or obtained by storage component 24 by any conventional means. Semiconductor device target data 46 may include dimensions (i.e., shapes and/or sizes) of features included in a physical semiconductor device (not shown). It is understood that semiconductor device target data 46 may represent the complete three-dimensional measurements of a semiconductor device including, for example: vias, lines, layers, interconnects, transistors, resistors, substrates, etc. Semiconductor device target data 46 may further include multi-dimensional relationships between components of a semiconductor device. For illustrative purposes, target for process Nmax O-301 and other designs, targets and contours shown and described herein will be referred to in two-dimensional space. However, it is understood that the teachings contained herein may be applied to three-dimensional shapes/measurements.

In any case, target for process Nmax O-301 acts as an input to mask data preparer (MDP) 40 for generation of a photomask design. This photomask design includes a plurality of photomask shapes (O-302A). In step 302, MDP 40 may use any conventional algorithm for generating a photomask design and one or more targets for processes 1, 2, 3, etc. (O-303) from semiconductor device target data 46. Mask data preparer 40 may, for example, use a conventional MDP process as described with respect to the prior art. The photomask design may include, for example, dimensions (i.e., shapes and/or sizes) and spatial relationships between photomask shapes O-302A. For example, mask shapes O-302A may include length and width dimensions of openings in the mask, as well as depth and gradient dimensions. As shown in FIG. 6, for example, photomask design 505 may include composite shapes having rectangular and/or squared shapes of differing sizes. Targets 502, 503, 504 may define dimensions of individual shapes formed during each respective process (i.e., photomask, lithography, etch) in building the photomask. For example, mask target 504 may be a subset of dimensions included in photomask design 505. In any case, as used herein, the term photomask shapes O-302A refers to either or both of the shapes included in the photomask design and the relationships between those shapes within the photomask design.

Also in step 302, MDP 40 may further generate a target for an initial process 1. This target is represented in FIG. 5 as object 303 (O-303). Use of target for process 1 (O-303) in conjunction with other features of photomask design verification program 30 is further described herein. It is understood that MDP 40 may generate a target representing each of the semiconductor manufacturing processes outlined and described herein (e.g., all processes subsequent to initial process 1). In one embodiment, in step 302, MDP 40 may generate a mask target (e.g., a target for process 1), a lithography target (e.g., a target for process 2), and an etch target (e.g., a target for process 3). These targets are represented in FIG. 5 as object O-303, and it is further understood that MDP 40 may generate additional targets as well. Specific examples of targets for the mask, lithography and etch processes are shown and described with reference to FIG. 6.

After generating mask shapes O-302A, MDP 40 may provide mask shapes O-302A to simulator 50. In step 305, simulator 50 may simulate an initial semiconductor manufacturing process 1. It is understood that while FIG. 5 shows step 305 as "Simulate Process N", that N=1 during the initial semiconductor manufacturing process simulation. Process 1 may include, for example, generating a plurality of photomask (mask) contours. In step 305, simulator 50 may generate these mask contours O-306 using mask shapes O-302A and variation models for process 1, 2, 3, etc. (variation models, O-304). Variation models O-304 may account for process variations that occur due to, for example, focusing errors in the lithography exposure tool, non-uniformity in hot plate temperature, or inconsistencies in film deposition thickness. Variation models may include any standard statistical models which predict likely variations in a process N.

In any case, variation models O-304 and mask shapes O-302A both contribute to the production of contours for process N (O-306). In the example described above, contours for process 1 O-306 represent simulated mask shapes. Turning to FIG. 6, an example of a mask contour 506 is shown, along with a mask target 504 and a mask contour error 510. In this case, mask target 504 is generated by MDP 40, in a process similar to that described above. Mask contour 506 is generated by simulator 50 using mask shapes 302A and variation models (O-304, FIG. 5) for the mask formation process.

Returning to FIG. 5, and with continuing reference to the example of FIG. 6, in step 307, identifier 60 compares contours for process N (O-306) (e.g., mask contour 506) with target for process N (O-303) (e.g., mask target 504) to identify deviations in contour O-306 (e.g., mask contour 506). Identifier 60 may determine deviations in contour for process N (O-306) (e.g., mask contour 506) via any conventional data analysis/comparison method including a direct edge-to-edge distance measurement and an area measurement of the error region. These deviations may be significant (e.g., classified as "errors" that require reporting) or may be insignificant (e.g., small enough not to require reporting). In any case, identifier 60 identifies deviations in contour for process N (O-306) (e.g., mask contour 506), whether those deviations are significant or not.

In step 308, comparator 70 compares the deviations identified by identifier 60 to predetermined fail limits for process N. In the example described above, comparator 70 compares the deviation between mask contour 506 and mask target 504 to predetermined fail limits for the mask formation process (1). Predetermined fail limits may include, for example: spacings that inhibit or make difficult the proper removal of residual material during a cleaning step, or features that are not structurally sound (e.g., too small to stand). These predetermined fail limits may further have information about acceptable tolerances (insignificant deviations), where deviations that fall within these acceptable tolerances are not reported. In decision D-309, comparator 70 decides whether the deviation is within an acceptable tolerance. In the case that comparator 70 finds the deviation to be outside of an acceptable tolerance, in step 311, comparator 70 reports the deviation as an error object (object O-310). In the example of FIG. 6, mask contour error 510 may indicate that mask target 504 includes features that are not "printable" due to process variations (i.e., features are too small). Mask contour error 510 (and other reported errors) may be transmitted individually to a conventional external memory structure (not shown), to a user interface (user 36), to storage system 21 via i/o component 26, to a portion of storage component 24, to another memory structure for logging of reported errors, etc. Further, reported errors may be logged and cached locally at computer system 20 and later transmitted as a group to another computer device.

It is understood that while errors are described as being reported, each simulation described herein involves generating and storing a verification result for that simulation. A verification result may include, for example, any indication that deviations exist, any indication that errors exist, etc. For example, the method described with reference to FIG. 5 may include generating and storing a verification result after decision D-309 indicating that deviations exist, but that those deviations are within an acceptable tolerance. In one embodiment, comparator 70 may generate a verification result, which may be stored in any computer readable storage medium described herein or known in the art, e.g. storage system 21 or storage component 24.

In decision D-312, simulator 50 determines whether process N is the final process to be simulated in the larger semiconductor manufacturing process (Nmax). That is, simulator 50 determines whether further simulation is necessary to verify the photomask design (including mask shapes O-302A). In the case that process N is the final process (e.g., N=Nmax), then the photomask design verification process shown in FIG. 5 is complete (step 314). However, in the case that process N is not the final process (e.g., N<Nmax), in step 313, simulator 50 changes the value of N to reflect a subsequent process step (e.g., N=N+1). In the example described above and shown in FIG. 6, simulator 50 simulates the lithography (litho) process, creating contours for process N+1 (O-306) (e.g., lithography contours 507). It is understood that simulator 50 may perform simulation of the lithography process in a substantially similar manner as described with reference to the mask formation process. However, the subsequent process step (e.g., lithography) differs from the initial semiconductor manufacturing process (e.g., mask formation) in that the subsequent process N uses the contours for the initial process N (O-306) (e.g. mask contour 506) in place of mask shapes 302A. That is, mask shapes O-302A are only used during simulation of the initial process step 1, and in subsequent processes thereafter, contours from the preceding process are used as inputs to simulator 50. It is further understood that variation models 304 are specific to each process N=N+1, N=N+2, N=N+3, etc. and that simulator 50 uses variation models specific to each of those processes.

Where the subsequent process N is a lithography process, simulator 50, identifier 60 and comparator 70 may function substantially similarly as described with reference to the photomask formation process (initial process 1). Further, as described herein, identifier 60 may use a target (generated by MDP 40) for subsequent process N (e.g., target for process N+1(2), O-303) to identify deviations between, e.g., lithography contour 507 and lithography target 503. After identifier 60 identifies these deviations, steps 308 thru 313 may be repeated, and a further subsequent process step N+1 may be simulated until the final process step Nmax is reached.

FIG. 6 also illustrates the products of a further subsequent process N (etching, e.g., N+2), where simulator 50 has generated etch contour 508. It is understood that simulator 50 generates etch contour 508 using variation models for the etch process (process 3, O-304 of FIG. 5), and contours for the preceding process (O-306; e.g., litho contours 507). In this example, the target for process 3 is etch target 502. After simulator 50 generates etch contour 508, identifier 60 and comparator 70 may identify and compare deviations (e.g., etch contour error 514) between etch target 502 and etch contour 508 in a substantially similar manner as described above with respect to other targets and contours. While FIG. 6 illustrates etch (502), lithography (503) and mask (504) targets as compared with etch (508), lithography (507) and mask (506) contours, it is understood that more processes may be simulated and verified using the teachings of this disclosure. For example, processes such as: cleaning, polishing, deposition and annealing may be modeled using the teachings of this disclosure.

Figure 7:
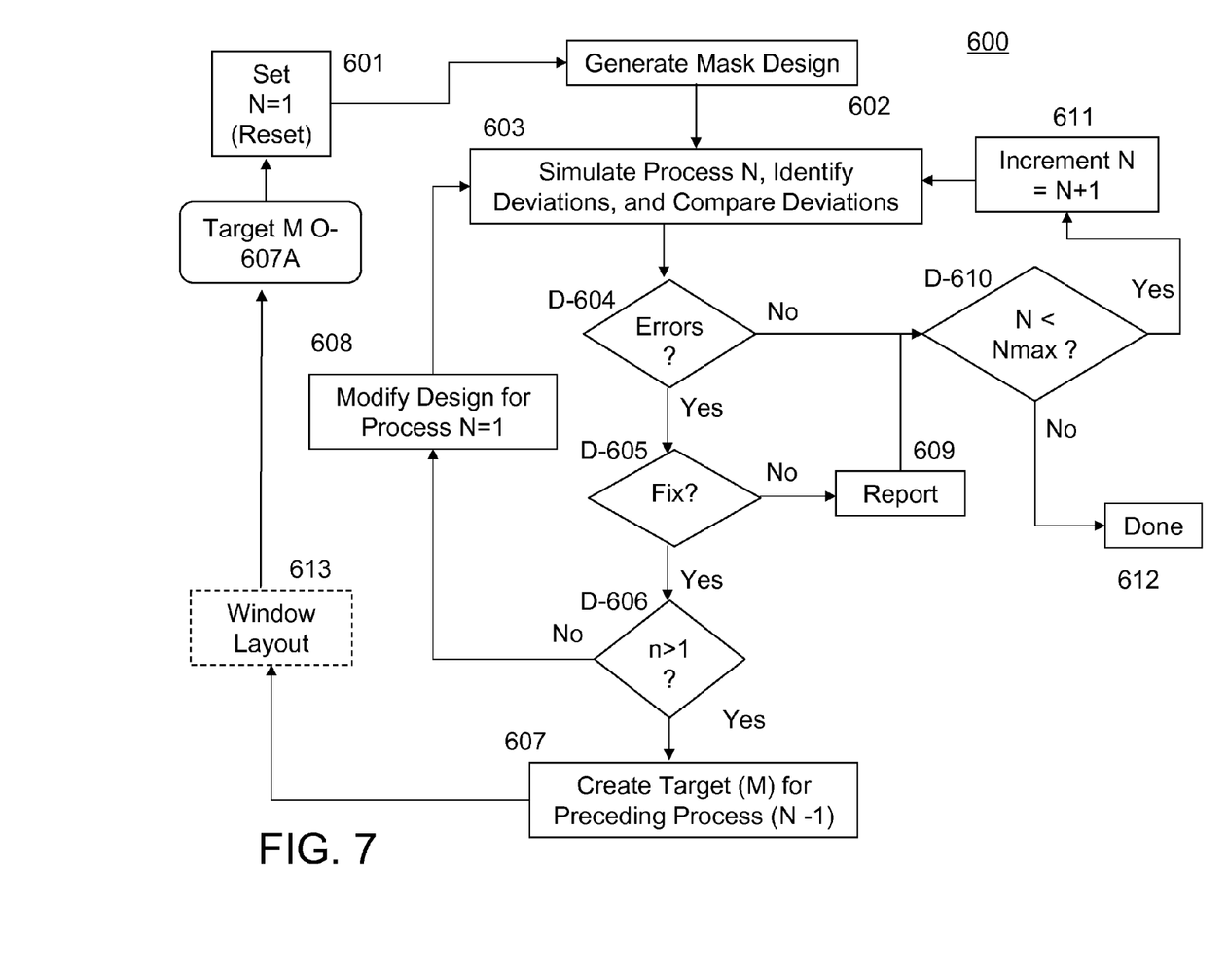
FIG. 7 shows a schematic flow diagram illustrating steps in a method of photomask design verification according to an embodiment of the invention.

Turning to FIG. 7, a schematic flow diagram 600 illustrating steps in detecting and correcting errors in a semiconductor manufacturing process is shown. In step 601, a first process (e.g., photomask design) is set as N, and in step 602, MDP 40 generates a photomask design (e.g., 505, FIG. 6) and targets (e.g., 502-504) as described with reference to step 302 and object O-303 in FIG. 5. In step 603, simulator 50, identifier 60 and comparator 70 may perform substantially similar steps as those described with reference to steps 305 thru 309 in FIG. 5. That is, in step 305, simulator 50 simulates a first process 1 to produce one or more contours for process 1 (object O-306); in step 307, identifier 60 identifies deviations in those contours (O-306); and in step 308, comparator 70 compares those deviations to fail limits for process 1. Returning to FIG. 7, in decision D-604, comparator 70 determines whether the deviation is significant enough to be classified as an error (e.g., mask contour error 510 of FIG. 6). If the deviation is not an error, then in decision D-610, comparator determines whether N is greater than Nmax. In the case that N=Nmax, comparator 70 completes the photomask design verification process at step 612. In the case that N<Nmax, in step 611, comparator 70 increments process N such that N=N+1. It is understood that steps and decisions D-610 thru step 612 may be performed substantially similarly to steps and decisions D-312 thru step 314 of FIG. 5.

In the case that an error exists (e.g., mask contour error 510 of FIG. 6), in decision D-605, corrector 80 may determine whether the error is able to be fixed. If the error cannot be fixed, in step 609, corrector 80 may report the error as similarly described with reference to step 311 of FIG. 5. An unfixable error may include, for example, a condition whereby a feature prints too small (e.g., structurally unsound) and the corresponding mask shape is at its maximum tolerable size. If the error can be fixed, in decision D-606, corrector 80 determines whether the N value for process N is greater than 1. In the case that N=1, in step 608, corrector 80 may modify the original mask design (generated by MDP 40) to create a modified mask design for the same process N=1. This modified mask design is then run through simulator 50, identifier 60 and comparator 70 as described above and with reference to FIGS. 5 and 6. Step 608 may be repeated until the initial process N=1 is free from fixable errors, at which point, comparator 70 will proceed with decisions and steps D-610 thru 611 and increment N=N+1.

Returning to step 606, where process N>1 (e.g., N=2), and a fixable error exists in the contour of process N, corrector 80 may correct the error in step 607 by creating a target (target M, object O-607A) for the preceding process (N−1). That is, corrector 80 may generate target M (O-607A) for the preceding process that will act as an input to MDP 40 in generating a mask design. It is understood that target M (O-607A) is a target for only the preceding process, and as such, differs from target for process Nmax (object O-301) of FIG. 5. For example, as described with reference to FIGS. 6 and 7, where process N is an etch process, target M (O-607A) may be a lithography target 503 (FIG. 6). In this case, with reference to FIG. 5 and the example of FIG. 6, lithography target 503 acts as an input to MDP 40 in regenerating mask shapes O-302A and targets for processes 1, 2, 3, etc. (O-303). As shown in schematic flow diagram 600 of FIG. 7, creation of target M (O-607A) triggers a resetting of N equal to 1 (step 601). In this case, MDP 40 regenerates the mask design and targets similarly as described with reference to step 302 and object O-303 of FIG. 5, however, the mask design and targets are further refined due to data provided in target M (O-607A). The steps shown and described with reference to FIG. 7 may be repeated until no further correctable errors exist.

In an alternative embodiment, step 613 allows for "window" layout and processing. In this case, MDP 40, simulator 50, identifier, 60, comparator 70 and corrector 80 may verify only portions of photomask design 505 (FIG. 6). For example, where a first portion of photomask design 505 is found not to have any errors, that first portion may be ignored in subsequent verification procedures. This may allow for photomask design verification program 30 to focus on a particular portion (or "window") of the design that contains errors. In general, each iteration of a portion of photomask design verification program 30 should run through at least the same interaction range as the preceding process step. For example, where identifier 60 and comparator 70 find errors over a range of 1.0 microns, the subsequent iteration (mask data preparation, simulation, identification, etc.) may not be "windowed" over a range of less than 1.0 microns. Preferably, the window layout 613 may be larger than the interaction range (e.g., 2.0 microns).

While shown and described herein as a photomask design verification program, it is understood that aspects of the invention further provide various alternative embodiments. For example, in one embodiment, the invention provides a computer program embodied in at least one computer-readable medium, which when executed, enables a computer system to verify photomask designs. To this extent, the computer-readable medium includes program code, such as photomask design verification program 30 (FIG. 4), which implements some or all of a process described herein. It is understood that the term "computer-readable medium" comprises one or more of any type of tangible medium of expression capable of embodying a copy of the program code (e.g., a physical embodiment). For example, the computer-readable medium can comprise: one or more portable storage articles of manufacture; one or more memory/storage components of a computing device; paper; and/or the like.

In another embodiment, the invention provides a method of generating a system for verifying photomask designs. In this case, a computer system, such as computer system 20 (FIGS. 3-4), can be obtained (e.g., created, maintained, made available, etc.) and one or more modules for performing a process described herein can be obtained (e.g., created, purchased, used, modified, etc.) and deployed to the computer system. To this extent, the deployment can comprise one or more of: (1) installing program code on a computing device from a computer-readable medium; (2) adding one or more computing and/or I/O devices to the computer system; and (3) incorporating and/or modifying the computer system to enable it to perform a process described herein.

It is understood that aspects of the invention can be implemented as part of a business method that performs a process described herein on a subscription, advertising, and/or fee basis. That is, a service provider could offer to provide processing instructions for verifying photomask designs as described herein. In this case, the service provider can manage (e.g., create, maintain, support, etc.) a computer system, such as computer system 20 (FIGS. 3-4), that performs a process described herein for one or more customers. In return, the service provider can receive payment from the customer(s) under a subscription and/or fee agreement, receive payment from the sale of advertising to one or more third parties, and/or the like.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method of verifying a photomask design performed using at least one computing device, the method comprising:

simulating an initial semiconductor manufacturing process using a plurality of mask shapes and variation models for the initial semiconductor manufacturing process, to generate a plurality of contours for the initial semiconductor manufacturing process, using the at least one computing device;

simulating a subsequent semiconductor manufacturing process using the contours for the initial semiconductor manufacturing process and variation models for the subsequent semiconductor manufacturing process, to generate a plurality of contours for the subsequent semiconductor manufacturing process, using the at least one computing device;

repeatedly simulating at least one further subsequent semiconductor manufacturing process using a plurality of contours for the subsequent semiconductor manufacturing process and variation models for the further subsequent semiconductor manufacturing process; and generating and storing a verification result for the photomask design on a computer readable storage medium.

2. The method of claim 1, further comprising:
generating a target for the initial semiconductor manufacturing process.

3. The method of claim 2, further comprising:
identifying a difference between the target for the initial semiconductor manufacturing process and the plurality of contours for the initial semiconductor manufacturing process in a case that a difference exists.

4. The method of claim 3, further comprising:
comparing the difference to a predetermined set of failure limits for the initial semiconductor manufacturing process; and
wherein the generating and storing a verification result includes logging an error in an error log in a case that the difference is outside of the predetermined set of failure limits.

5. The method of claim 4, further comprising:
determining whether a final semiconductor manufacturing process has been simulated in a case that the difference is within the predetermined set of failure limits.

6. The method of claim 5, further comprising initiating the simulating of the subsequent semiconductor manufacturing process in response to the determining that the final semiconductor manufacturing process has not been simulated.

7. The method of claim 1, further comprising:
generating a target for the subsequent semiconductor manufacturing process;
measuring a difference between the target for the subsequent semiconductor manufacturing process and the plurality of contours for the subsequent semiconductor manufacturing process in a case that a difference exists;
comparing the difference to a predetermined set of failure limits for the subsequent semiconductor manufacturing process;
logging an error in an error log in a case that the difference is outside of the predetermined set of failure limits and the error is not fixable;
creating a new target for a preceding semiconductor manufacturing process in a case that the error is fixable; and
repeating the simulating of the initial semiconductor manufacturing process using the new target and the variation models for the initial semiconductor manufacturing process, to generate a plurality of new contours for the initial semiconductor manufacturing process.

8. A system for verifying a photomask design, the system comprising:

a computer-implemented simulator for:
simulating an initial semiconductor manufacturing process using a plurality of mask shapes and variation models for the initial semiconductor manufacturing process, to generate a plurality of contours for the initial semiconductor manufacturing process;
simulating a subsequent semiconductor manufacturing process using the contours for the initial semiconductor manufacturing process and variation models for the subsequent semiconductor manufacturing process, to generate a plurality of contours for the subsequent semiconductor manufacturing process; and
repeatedly simulating at least one further subsequent semiconductor manufacturing process using a plurality of contours for the subsequent semiconductor manufacturing process and variation models for the further subsequent semiconductor manufacturing process.

9. The system of claim 8, further comprising:
a mask data preparer for generating a target for the initial semiconductor manufacturing process.

10. The system of claim 9, further comprising:
an identifier for identifying a difference between the target for the initial semiconductor manufacturing process and the plurality of contours for the initial semiconductor manufacturing process in a case that a difference exists.

11. The system of claim 10, further comprising:
a comparator for:
comparing the difference to a predetermined set of failure limits for the initial semiconductor manufacturing process; and
logging an error in an error log in a case that the difference is outside of the predetermined set of failure limits.

12. The system of claim 11, wherein the comparator further performs the following:
determines whether a final semiconductor manufacturing process has been simulated in a case that the difference is within the predetermined set of failure limits.

13. The system of claim 12, wherein the comparator further performs the following:
initiates the simulating of the subsequent semiconductor manufacturing process in response to the determining that the final semiconductor manufacturing process has not been simulated.

14. The system of claim 8, further comprising:
a mask data preparer for generating a target for the subsequent semiconductor manufacturing process;
an identifier for identifying a difference between the target for the subsequent semiconductor manufacturing process and the plurality of contours for the subsequent semiconductor manufacturing process in a case that a difference exists;
a comparator for:
comparing the difference to a predetermined set of failure limits for the subsequent semiconductor manufacturing process; and
logging an error in an error log in a case that the difference is outside of the predetermined set of failure limits and the error is not fixable; and
a corrector for creating a new target for a preceding semiconductor manufacturing process in a case that the error is fixable;
wherein the simulator repeats the simulating of the initial semiconductor manufacturing process using the new target and the variation models for the initial semiconductor manufacturing process, to generate a plurality of new contours for the initial semiconductor manufacturing process.

15. A computer program product stored on a computer readable storage medium, which when executed by a computer, performs the following:
   simulates an initial semiconductor manufacturing process using a plurality of mask shapes and variation models for the initial semiconductor manufacturing process, to generate a plurality of contours for the initial semiconductor manufacturing process;
   simulates a subsequent semiconductor manufacturing process using the contours for the initial semiconductor manufacturing process and variation models for the subsequent semiconductor manufacturing process, to generate a plurality of contours for the subsequent semiconductor manufacturing process; and
   repeatedly simulates at least one further subsequent semiconductor manufacturing process using a plurality of contours for the subsequent semiconductor manufacturing process and variation models for the further subsequent semiconductor manufacturing process.

16. The computer program product of claim 15, which further performs the following:
   generates a target for the initial semiconductor manufacturing process.

17. The computer program product of claim 16, which further performs the following:
   identifies a difference between the target for the initial semiconductor manufacturing process and the plurality of contours for the initial semiconductor manufacturing process in a case that a difference exists.

18. The computer program product of claim 17, which further performs the following:
   compares the difference to a predetermined set of failure limits for the first semiconductor manufacturing process; and
   logs an error in an error log in a case that the difference is outside of the predetermined set of failure limits.

19. The computer program product of claim 18, which further performs the following:
   determines whether a final semiconductor manufacturing process has been simulated in a case that the difference is within the predetermined set of failure limits.

20. The computer program product of claim 15, which further performs the following:
   generates a target for the subsequent semiconductor manufacturing process;
   measures a difference between the target for the subsequent semiconductor manufacturing process and the plurality of contours for the subsequent semiconductor manufacturing process in a case that a difference exists;
   compares the difference to a predetermined set of failure limits for the subsequent semiconductor manufacturing process;
   logs an error in an error log in a case that the difference is outside of the predetermined set of failure limits and the error is not fixable;
   creates a new target for a preceding semiconductor manufacturing process in a case that the error is fixable; and
   repeats the simulating of the initial semiconductor manufacturing process using the new target and the variation models for the initial semiconductor manufacturing process, to generate a plurality of new contours for the initial semiconductor manufacturing process.

* * * * *